United States Patent [19]
Chandross et al.

[11] Patent Number: 5,656,412
[45] Date of Patent: Aug. 12, 1997

[54] ENERGY-SENSITIVE RESIST MATERIAL AND A PROCESS FOR DEVICE FABRICATION USING AN ENERGY-SENSITIVE RESIST MATERIAL

[75] Inventors: Edwin Arthur Chandross, Murray Hill; Thomas Xavier Neenan, Jersey City, both of N.J.

[73] Assignee: Lucent Technologies Inc., Murray Hill, N.J.

[21] Appl. No.: 552,998

[22] Filed: Nov. 3, 1995

Related U.S. Application Data

[62] Division of Ser. No. 399,400, Mar. 7, 1995, abandoned.

[51] Int. Cl.$^6$ .......................... G03F 7/023; G03F 7/039; G03F 7/004
[52] U.S. Cl. .................. 430/270.1; 430/191; 430/192
[58] Field of Search ........................ 430/270.1, 191, 430/192

[56] References Cited

U.S. PATENT DOCUMENTS

| | | | |
|---|---|---|---|
| 3,028,239 | 4/1962 | Neugebauer et al. | 430/270 |
| 3,779,778 | 12/1973 | Smith et al. | 430/270 |
| 4,032,518 | 6/1977 | Kotlarchik, Jr. et al. | 526/288 X |
| 4,247,625 | 1/1981 | Fletcher et al. | 430/336 |
| 4,259,469 | 3/1981 | Wilson et al. | 526/288 |
| 4,289,865 | 9/1981 | Wilson et al. | 526/288 |
| 5,066,566 | 11/1991 | Novembre | 430/296 |
| 5,130,392 | 7/1992 | Schwalm et al. | 526/288 |
| 5,141,838 | 8/1992 | Aoshima et al. | 430/191 |

FOREIGN PATENT DOCUMENTS

| | | | |
|---|---|---|---|
| 0174405 | 10/1983 | Japan | 526/288 |
| 58-174405 | 10/1993 | Japan | 526/288 |

OTHER PUBLICATIONS

McGraw–Hill Dictionary of Chemical Terms, Sybil P. Parker, ed, McGraw–Hill Book Company, New York, NY, 1984, p. 408.

Adin et al. 18436, "Inhibition of image formation utilizing cobalt (III) complexes", Research Disclosure, Aug. 1979, pp. 446–454.

Primary Examiner—Cynthia Hamilton
Attorney, Agent, or Firm—Richard J. Botos

[57] ABSTRACT

The present invention is directed to energy-sensitive resist materials and to a process for device fabrication in which energy-sensitive resist materials are used. The energy-sensitive resist materials contain a polymer wherein at least 10 mole percent of the repeating units that make up the polymer have a sulfonamide moiety. The aqueous base solubility of the sulfonamide moiety provides the polymer with desirable properties. The energy sensitive resist materials also contain a compound that generates acid when exposed to radiation.

In the process of the present invention, a film of the energy-sensitive material is formed on a substrate. The film is exposed to delineating radiation. The pattern is developed by a post-exposure bake step followed by application of an aqueous base developer solution. Exposing the energy-sensitive resist material to radiation alters the aqueous base solubility of the energy-sensitive resist material, rendering the portion of the material that was exposed to radiation significantly more soluble in the developer solution than the portion of the material that was not exposed to radiation. Because the sulfonamide moiety is soluble in developer solution, less of a chemical change is needed to convert the energy sensitive resist material from relatively insoluble to relatively soluble in aqueous base developer solution than comparable energy sensitive resist materials that do not have sulfonamide moieties incorporated into the polymers contained therein.

6 Claims, 2 Drawing Sheets

ENERGY-SENSITIVE RESIST MATERIAL AND A PROCESS FOR DEVICE FABRICATION USING AN ENERGY-SENSITIVE RESIST MATERIAL

This application is a division of application Ser. No. 08/399,400, filed on Mar. 7, 1995, now abandoned.

BACKGROUND OF THE INVENTION

1. Technical Field

The invention is directed to an energy sensitive material and a process for device fabrication in which the energy sensitive resist material is used.

2. Art Background

Devices such as integrated circuits are complex structures made of a variety of materials. These materials are precisely configured to form the desired device by a variety of processes. A lithographic process is frequently used to transfer the desired configuration into a substrate to fabricate such devices.

Lithographic processes use intermediate materials frequently referred to as resists. A positive or negative image of the desired configuration is first introduced into the resist by exposing it to patterned radiation which induces a chemical change in the exposed potions of the resist. This chemical change is then exploited to develop a pattern in the resist, which is then transferred into the substrate underlying the resist.

The efficacy of a lithographic process depends at least in part on the resist used to transfer the pattern into the substrate. Certain types of resists offer particular advantages in the context of specific lithographic processes. For example, certain resists use chemical amplification to provide increased radiation sensitivity; i.e., the radiation produces a catalytic agent which induces a chemical event which propagates, resulting in multiple other chemical events. The effect of the radiation is amplified because one photon generates many chemical events.

Certain chemically amplified: resists contain a polymer in which the aqueous base solubility of the polymer is reduced by pendant protective groups which are removed from the polymer by the catalytic agent that is produced by incident radiation. The resist material in the exposed region, but not the unexposed region, consequently undergoes an increase in aqueous base solubility. The difference in the aqueous base solubility between the unexposed and exposed regions of the resist is then exploited to develop a topographic pattern.

One class of chemically amplified resists, disclosed in U.S. Pat. No. 4,939,070 to Ito et al., contains hydroxystyrene polymers that have recurrent pendant groups such as t-butoxycarbonyl (tBOC) groups. These groups replace the hydrogen in the hydroxyl moiety pendant to the styrene polymers phenyl moieties and reduce the inherent aqueous base solubility of the hydroxystyrene when so attached. These protective, masking groups are cleaved from the polymer, generally by heating after the exposure, in the presence of acid which is generated from a dissolved photoacid generator (PAG) by exposing the resist to radiation. When the masking groups are cleaved from such polymers, they are replaced by hydrogen atoms to yield free phenols and, as a result, the polymers aqueous base solubility changes from relatively insoluble to relatively soluble.

It is an objective of a lithographic process for device fabrication to transfer a device pattern from a resist into a substrate as accurately as possible. It follows that it is desirable to avoid shrinkage in patterned resists that cause a concomitant distortion in the resist image and the resulting device pattern. Because of the undesirable shrinkage that results when the masking groups are cleaved from the polymer, it is desirable to minimize the number of these groups that are cleaved to obtain the desired effect. One solution to the problem of polymer shrinkage during deprotection is described in U.S. Pat. No. 5,385,809, to Bohrer et al. In Bohrer et al. the polymers are partially deprotected prior to irradiation, thereby reducing the amount by which the polymer shrinks when exposed to radiation and thermally developed.

A resist shrinks when thee bulky protective groups are removed from the polymer in substantial numbers. The fewer the number of these protective groups that are removed per unit of polymer, the less the polymer will shrink. To obtain a pattern that is truer to the desired pattern, a chemically amplified resist that contains a smaller fraction of protective groups and shrinks less upon aleprotection is desired.

SUMMARY OF THE INVENTION

The present invention is directed to a lithographic process for device fabrication which utilizes an energy sensitive resist material that contains a polymer with sulfonamide moieties either pendant to or incorporated in the polymer backbone. The aqueous base solubility of the sulfonamide moiety ($pK_a$ of about 10) is exploited to enhance the properties of polymers that are incorporated into energy sensitive resists. By contributing to the overall aqueous base solubility of the polymer, the sulfonamide moieties reduce the degree of chemical change needed to convert the resist material from relatively insoluble to relatively soluble in aqueous base developer solution. By reducing the degree of chemical change required, adverse processing consequences that result from this change (e.g., polymer shrinkage) are also reduced.

The sulfonamide-containing polymer of the present invention is either a polymerization product of monomers with sulfonamide groups pendant thereto or a condensation polymer with sulfonamide groups in the polymer backbone. The polymerization product of two or more monomers is referred to herein as a copolymer, although it may be the polymerization product of more than two monomers. A copolymer is a generally random sequence of repeating units. It is advantageous if at least 10 mole percent of the repeating units in the polymers of the present invention contain a sulfonamide moiety.

The sulfonamide-containing polymer with the sulfonamide moieties pendant to the polymer backbone is the polymerization product of a sulfonamide-containing monomer with the following general structures:

in which X is either $NHSO_2$ or $SO_2NH$, and $R_A$ is a lower alkylene moiety that contains 4 or fewer carbon atoms. Examples of suitable lower alkylene moieties include methylene, ethylene, and propylene. $R_B$ is an alkyl group or an aryl alkyl group. Examples of these alkyl groups include methyl, ethyl, propyl, isopropyl, benzylbutyl, and isobutyl. $R_C$ contains ethylenic unsaturation and either an aryl or aliphatic moiety. Examples of $R_C$ include styryl and methacryl-based moieties. It is advantageous if the monomer has the structure:

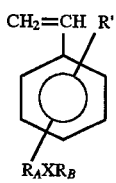

where $R_A$, X, and $R_B$ are as previously described. The moiety $R_A XR_B$ is in the meta or para position. It is contemplated that the monomer may be a mixture of the meta and para isomers. It is possible for the phenylene moiety to have additional substituents, R', that are not hydrogen (H) atoms. Examples of suitable R' substituents are lower alkyl groups. The sulfonamide-containing polymer is the polymerization product of the above monomers and other monomers. However, it is advantageous if the polymer is about 30 mole percent to about 90 mole percent of the above sulfonamide-containing monomers.

In one embodiment of the present invention, at least a portion of the other monomer or monomers with which the sulfonamide-containing monomers are copolymerized have pendant acid labile groups. These acid labile groups are attached to weakly acidic moieties and thus mask the aqueous base solubility of these weakly acidic moieties. Once these acid labile groups are cleaved from the polymer, the polymer is more soluble in aqueous base solution. This difference in aqueous base solubility is exploited to develop a pattern in a resist from the image formed in the resist via the patternwise exposure. Since the sulfonamide moiety is relatively soluble in aqueous base, it follows that fewer acid labile groups must be removed to render the polymer soluble in aqueous base relative to the portion of the polymer from which the acid labile groups have not been removed. It is advantageous if the polymer has at least about 10 mole percent of these monomers incorporated therein. It is advantageous if the amount of these monomers in the polymer does not exceed 50 mole percent.

Examples of the acid labile groups include t-butyl, t-butoxycarbonyl (t-BOC hereinafter), t-amyloxycarbonyl, 2 methyl-3-trimethylsilyl-2-propanyloxycarbonyl, tetrahydropyranyl, and other substituents that easily undergo cleavage of the acid labile group in the presence of acid. In the presence of acid, these groups produce a free phenol and a volatile olefin.

The polymers of this embodiment of the present invention are the polymerization products of the above described monomers either alone or in combination with other monomers. These other monomers are contemplated to be those monomers that add other deskable properties to resist polymers. Examples of these monomers include sulfur dioxide (SO$_2$), acetoxystyrene monomers, and trimethylsilylstyrene monomers. If these monomers are used to synthesize the polymers of the present invention, these monomers are about 20 mole percent to about 40 mole percent of the resulting polymer.

In this embodiment, the energy sensitive resist material contains the above-described polymer combined with a photoacid generator (PAG). The PAG generates acid when exposed to radiation. Typically about 3 weight percent to about 15 weight percent PAG is incorporated into the energy-sensitive resist material. If the PAG content is above about 15 weight percent of the resist material, the optical density of the resist material may be too high and its presence above this concentration may hinder feature development. The acid cleaves the acid labile groups from the polymer, typically during a post-exposure bake. The cleavage of these acid labile groups from the polymer causes the exposed resist material to be more soluble than the unexposed resist material in aqueous base solution. An aqueous base developer solution is then used to dissolve and remove the exposed resist material. The unexposed resist material is not so dissolved. The unexposed resist material is then used as a patterned mask for subsequent processing of the underlying substrate; typically for pattern transfer into the substrate.

With proper processing, a resist composition that contains sulfonamide-containing polymer loses less than 20 percent of its volume during the imaging and post-exposure baking steps in the lithographic process. It is advantageous if the polymer has an optical density of less than about 0.2 absorbance units/μm at the exposure wavelength (typically about 248 nm). This is an improvement over hydroxystyrene-containing polymers, which have both a higher absorbance and exhibit a degradation in lithographic properties over time.

In a second embodiment, the polymer is a sulfonamide-containing matrix resin that is combined with a dissolution inhibitor and a PAG to form the energy sensitive resist material. In this embodiment, the matrix-resin is inherently soluble in aqueous base developer solutions. The solubility of the matrix-resin is hindered by the dissolution inhibitor. In this embodiment the polymer is unaffected by the acid generated by the PAG when the energy sensitive material is exposed to radiation. This dissolution inhibitor changes from relatively insoluble to relatively soluble when exposed to the acid generated by the PAG. Examples, of suitable sulfonamide-containing matrix resins are the copolymerization products of the above-described sulfonamide-containing monomers and other monomers such as styrene monomers, vinyl monomers, acetoxystyrene monomers, methacrylate monomers, methacrylamide monomers, and maleimide monomers.

Another category of suitable sulfonamide-containing matrix resins contains condensation polymers with repeat units of the general formula:

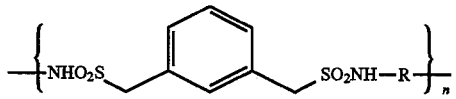

It is contemplated that the condensation polymer illustrated above is either a homopolymer, i.e. the polymerization product of one monomer (R is the same moiety throughout the polymer) or a copolymer, i.e., the polymerization product of two or more monomers (R is two or more different moieties). It is advantageous if the condensation polymer is the polymerization product of at least one diamine and a disulfonyl halide. The diamines are either aliphatic or arylene alkyl. It is advantageous if the diamines are selected so that the resulting polymer is readily formed into a suitable film. One skilled in the art will recognize the criteria for selecting suitable diamines. Examples of suitable diamines include xylylenediamine and 1,3-cyclohexyl-bismethylamine. An example of a suitable disulfonyl halide is m-xylylenesulfonyl chloride. Examples of suitable R groups include xylylene, n-butylene, n-hexylene, and 1,3-cyclohexanebismethylene.

In this embodiment, the sulfonamide-containing matrix resin is combined with a dissolution inhibitor. One class of dissolution inhibitors includes those described in Reiser, A., *Photoreactive Polymers: The Science and Technology of Resists*, chapters 5 and 6 (John Wiley & Sons, pub. 1989) which is hereby incorporated by reference. Diazides such as napthoquinonediazide and a pentaester of a hexahydroxyspirobifluorene with napthoquinone-2-diazide-5-sulfonic acid are examples of such dissolution inhibitors. It is advantageous if the energy-sensitive resist material is about 10 to about 20 weight percent dissolution inhibitor with a molecular weight of less than about 1000. If the dissolution inhibitor has acid labile substituents which mask its aqueous base solubility, the dissolution inhibitor is used in conjunction with a PAG as previously described. In this embodiment, the amount of PAG in the energy sensitive resist material is about 3 weight percent to about 15 weight percent.

The polymers that are used in conjunction with a dissolution inhibitor also have an absorbance of about 0.2 absorbance units per 1 μm or less when exposed to radiation with a 248 nm wavelength. In this regard, it is advantageous if the sulfonamides are alkyl sulfonamides, since aryl sulfonamides have a higher absorbance at the 248 nm wavelength.

DETAILED DESCRIPTION

Figure 1:
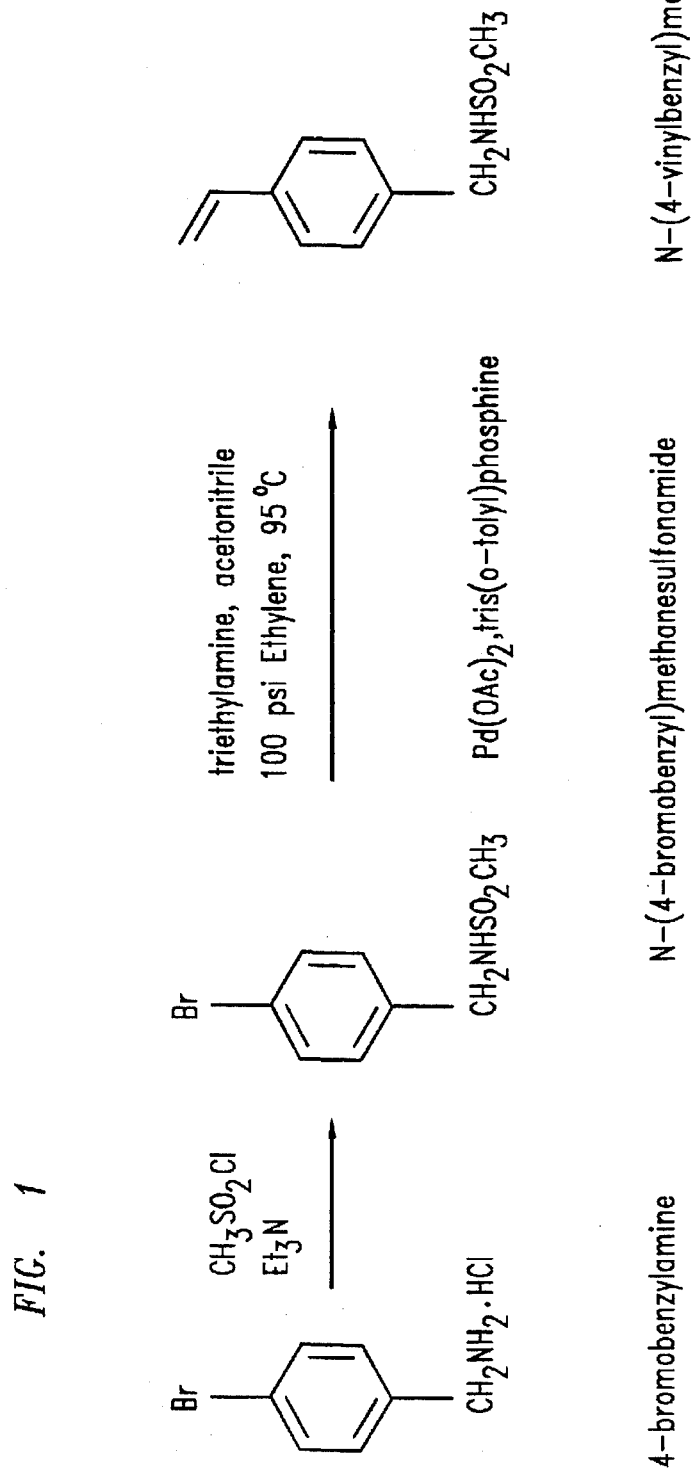
FIG. 1 is a schematic diagram of a reaction mechanism for the synthesis of N-(4-vinylbenzyl) methanesulfonamide.

The present invention is directed to a class of energy-sensitive resist materials that are useful in lithographic processes for device fabrication. Processes for device fabrication which include lithographic steps have been described in treatises such as S. M. Sze, *VLSI Technology*, (McGraw-Hill pub., 1983) and L. F. Thompson et at. *Introduction to Microlithography*, pp. 87–161 (American Chemical Society Symposium Series 219, 1983). Lithographic steps typically include exposing and patterning energy delineable materials such as resist materials. As image is first introduced into the resist and developed to form a pattern, which is then transferred into the substrate.

The materials are energy-sensitive; i.e., energy induces a chemical change in these materials. When these materials are exposed to patterned radiation of the appropriate wavelength, about 190 nm to about 370 nm in the context of the present invention, this chemical change is induced to a significantly greater extent in the portion of the resist material that is exposed to radiation than in the portion of the resist material that is not directly exposed to radiation. In the context of the present invention, significantly greater means that the chemical contrast induced by the patternwise exposure is adequate to meet processing objectives. This chemical difference is exploited to develop the pattern in the energy-sensitive resist material. The developed pattern is then used in subsequent processing, e.g., transfer of the developed pattern into a underlying substrate.

Aqueous base solutions are typically used to develop patterns in energy sensitive resist materials. One common example of an aqueous base solution is an aqueous solution of tetramethylammonium-hydroxide (TMAH) that is about 0.1M to about 0.5M, although many other solutions are well known to one skilled in the art.

In the positive-tone resist materials of the present invention, the material that is not exposed to radiation is relatively insoluble in the aqueous base developer solution relative to the material that is exposed to radiation. This difference in aqueous base solubility is effected either by manipulating the aqueous base solubility of the polymer in the energy sensitive material, or by manipulating the aqueous base solubility of a dissolution inhibitor in the energy-sensitive resist material.

In one embodiment of the present invention, sulfonamide-containing copolymers with pendant acid labile groups are incorporated into resist materials that are used in lithographic processes for device fabrication. The sulfonamide-containing polymer is the polymerization product of a monomer with the following general structures:

in which X is either $NHSO_2$ or $SO_2NH$ and $R_A$ is a lower alkylene moiety that contains 4 or fewer carbon atoms. Examples of suitable alkylene moieties include methylene, ethylene, and propylene. $R_B$ is an alkyl group or an aryl alkyl group. Examples of the alkyl groups are methyl, ethyl, propyl, isopropyl, butyl, and isobutyl. Examples of the aryl alkyl groups include methylphenyl and methoxyphenyl. $R_C$ contains ethylenic unsaturation and either an aryl or aliphatic moiety. Examples of $R_C$ include styryl and methacryl-based moieties. If $R_C$ is styryl, the phenylene moiety that acts a bridge between the vinyl group and $R_A$ is either unsubstituted or further substituted. If further substituted, it is advantageous if these substituents are lower alkyl groups so that the absorbance and the aqueous solubility of the resulting polymer meet desired processing objectives.

The polymer is either a homopolymer or the polymerization product of two or more different monomers. Although the polymerization product of at least two monomers is referred to herein as a copolymer, it is contemplated that the polymer may be the polymerization product of more than two monomers. The copolymer is formed by polymerizing a feed composition that contains a sulfonamide monomer as described generally herein and other monomers. At least one of these other monomers is typically a styrene monomer with acid labile groups pendant thereto. One example of these styrene monomers is tBOC oxystyrene. Other examples of these monomers are described in U.S. Pat. No. 5,066,566 to Novembre et al, which is hereby incorporated by reference. If the resist material contains a polymer with pendant acid labile groups, the feed composition contains at least about 10 mole percent of a styrene-containing monomer with acid-labile groups pendant thereto and no more than about 90 mole percent of the sulfonamide monomers.

The pendant acid labile groups are used to manipulate the aqueous base solubility of the copolymers that contain them. For example, the pendant acid labile groups reduce the aqueous base solubility of the copolymers if they mask the acidity of other moieties that are pendant to the polymer. In a specific illustration, the hydrogen of a phenolic hydroxyl moiety in a hydroxystyrene polymer is substituted by an acid labile group such as tBOC. Since the hydroxyl functional group of the hydroxystyrene monomer is weakly acidic, hydroxystyrene is relatively soluble in a solution of aqueous base. The tBOC group is unaffected by a solution of aqueous base. Consequently, a copolymer containing hydroxystyrene with pendant tBOC groups that mask the aqueous base solubility of a portion of the phenolic hydroxyl functional groups is less soluble in aqueous base relative to a copolymer containing hydroxystyrene with no such pendant tBOC groups. The hydroxyl functionality is thus "protected" by the pendant tBOC groups. Removing these tBOC groups "deprotects" the hydroxyl functionality.

When these acid labile groups are cleaved from the polymer, the polymer is more soluble in aqueous base solution. This difference in aqueous base solubility is exploited to develop a pattern in a resist from the image transferred into the resist via the patternwise exposure.

It is advantageous if the polymer is at least 10 mole percent of the monomers with the acid labile groups pendant thereto. As stated previously, it is advantageous if the number of these acid labile substituents that are removed is no more than the number necessary to bring about the desired contrast in aqueous base solubility. A polymer with fewer of the protective groups attached thereto in the first instance will shrink less upon deprotection, because the volume change when commensurately fewer of these bulky groups are cleaved from the polymer is commensurately less. For this reason, it is advantageous if the monomer with the acid labile substituent is 50 mole percent or less of the polymer.

The degree of difference in the aqueous base solubility between the polymer in one area of the resist versus another is related to the relative number of free acidic groups, formed by removing acid labile groups pendant to the polymer in these two regions. The acid labile pendant groups are cleaved from both regions of the resist if the resist is exposed to heat above a certain temperature. Uniform thermal cleavage of the acid labile pendant groups from both the unexposed and exposed areas of the resist does not contribute to the contrast between the two areas and is, for this reason, undesirable.

During a lithographic process, the resist is heated after being exposed to radiation. To avoid the above noted problem of uniform cleavage, it is advantageous if the resist is heated to a temperature which is less than the temperature at which these pendant groups will cleave from the polymer in the absence of an acid catalyst, generally this thermal deprotection commences at about 140° C.

The sulfonamide-containing polymers of this embodiment also have other properties which make them attractive for use in a resist material. The decomposition temperature of the polymer backbone, $T_d$, is above about 340° C., and the glass transition temperature, $T_g$, of the polymer is above 100° C. These properties provide the polymer with a good resistance to distortion during the lithographic process, especially during the baking step following the exposure step and any temperature increases during subsequent pattern transfer steps.

In a further embodiment, it is contemplated that the sulfonamide monomer and the acid labile group monomer are copolymerized with at least one other monomer. Examples of these monomers include acetoxystyrene, trimethylsilylstyrene, methanesulfonyloxystyrene, various methacrylate monomers, and $SO_2$. In this further embodiment, the polymer contains about 20 mole percent to about 40 mole percent of these monomers. Conventional methods well known to one skilled in the art are used to synthesize the polymers described above and are not described in detail here. However, examples of suitable synthesis are set forth in the examples.

In this embodiment, the sulfonamide-containing copolymer is combined with other materials to form the resist. It is contemplated that the sulfonamide-containing polymer is combined with a PAG to form the resist. It is advantageous if the PAG is about 3 weight percent to about 15 weight percent of the energy-sensitive resist. If the resist material contains more than about 15 weight percent of the PAG, the optical density of the energy-sensitive resist material may be too high and it may hinder feature development. The photoacid generator generates an acid when exposed to certain forms of energy. The acid so generated cleaves the acid labile groups from the sulfonamide-containing resist polymer during a post exposure baking step, rendering the exposed areas of the polymer more soluble in aqueous base relative to the unexposed areas. Examples of suitable photoacid generators include bis(2-nitro-6-trifluoromethylbenzyl)1-3-benzenedisulfonate and other such materials disclosed in U.S. Pat. Nos. 4,996,136 and 5,200,544, both to Houlihan et al., the teachings of which are incorporated by reference.

The resist is applied onto a substrate using known techniques and is then patternwise exposed to radiation with a wavelength preferably in the range of about 190 nm to 370 nm. The radiation dosage preferably does not exceed about 100 ml/cm² for an exposure of about 248 am radiation. The patterned resist is then subjected to a post exposure baking step at a temperature of about 110° C. to about 170° C., preferably at about 120° C. The composition of the copolymer in the resist is such that the weight loss of the resist after exposure to radiation and baking is less than about 20%.

In a second embodiment, the polymer is a sulfonamide-containing matrix resin that is combined with a dissolution inhibitor to form the energy sensitive resist material. The polymer is relatively soluble in aqueous base solution, but that solubility is hindered by the dissolution inhibitor. In this embodiment, the dissolution inhibitor undergoes a chemical change when the energy sensitive material is exposed to radiation. The chemical change converts the dissolution inhibitor from relatively insoluble to relatively soluble in aqueous base solution. Utilizing a matrix polymer with sulfonamide moieties again reduces the amount of change in the dissolution inhibitor needed to change the energy-sensitive material from relatively soluble to relatively insoluble.

Examples of suitable sulfonamide-containing matrix-resins are the copolymerization products of the above-described sulfonamide-containing monomers and other monomers such as styrene monomers, vinyl monomers, acetoxystyrene monomers, methacrylate monomers, methacrylamide monomers, and maleimide monomers. Since, in this embodiment, the matrix resin is chemically inactive, acid-labile substituents are not incorporated into the polymer.

Another example of suitable sulfonamide-containing matrix resins are condensation polymers of at least one diamine and a disulfonyl halide. The condensation synthesis of polysulfonamides using diamine and ctisulfonyl chloride precurors is described in Sundet, S. A., et al., *J. Polymer Science*, Vol. XL, pp. 389–397 (1959) which is hereby incorporated by reference. The diamines are either aliphatic or aromatic. If more than one is used, it is advantageous if the diamenes are selected so that the resulting film will have desirable film-forming properties. Examples of such diamines include xylylenediamine, and, 1,3-cyclohexanebismethylamine. Examples of suitable disulfonyl halides include m-xylylenesulfonyl chloride. It is advantageous if the polymers have a repeating unit of the general formula:

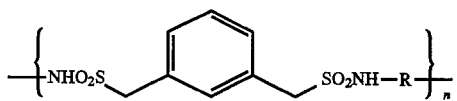

Examples of suitable R groups include m-xylylene, p-xylylene, 1,4 butylene, 1,6-n-hexylene, and 1,3-cyclohexanebismethylene. It is contemplated that the condensation polymer is a combination of one or more of the above described repeating units. For example, homopolymers wherein R is either m- xylylene, 1,4-n-butylene, 1,6-n-hexylene, or 1,3-cyclohexanebismethylene are contemplated. Also, copolymers wherein R is m-xylylene in about 70 mole percent or more of the polymer and R is p-xylylene in about 30 mole percent or less of the polymer are contemplated. Copolymers wherein R is m-xylylene in about 97 mole percent to about 99 mole percent of the polymer and R is 1,3-cyclohexylbismethylene in about 1 mole percent to about 3 mole percent of the polymer are also contemplated.

In this embodiment, the sulfonamide-containing matrix resin is combined with a dissolution inhibitor. One class of dissolution inhibitors are those described in the above-cited reference to Reiser. Diazides such as napthoquinonediazide and a pentaester of a hexahydroxyspirobifluorene with napthoquinone-2-diazide-5-sulfonic acid are examples of such dissolution inhibitors. It is advantageous if the energy-sensitive resist material is about 10 to about 20 weight percent dissolution inhibitor with a molecular weight of less than about 1000.

Another class of dissolution inhibitors change from relatively insoluble to relatively soluble in aqueous base solution in the presence of acid. This class of dissolution inhibitors is used in conjunction with a PAG. PAGs of the type and the amount previously described are useful.

The polymers of the present invention have an absorbance of about 0.2 absorbance units/μm or less at a 248 nm wavelength. In this regard, it is advantageous if the sulfonamides are alkyl sulfonamides, since aryl sulfonamides have a higher absorbance at the 248 nm wavelength.

The following examples are provided to illustrate certain embodiments of the invention that is defined by the claims appended to this description.

Example 1: Synthesis of N-(4-vinylbenzyl) methanesulfonamide

The synthesis of N-(4-vinylbenzyl) methanesulfonamide is illustrated schematically as FIG. 1. A suspension was prepared of 4-bromobenzylamine hydrochloride (10 g; 45 mmol) in a solution of methylene chloride/triethylamine (1:1 v/v; 100 mL). The 4-bromobenzylamine hydrochloride was obtained from the Aldrich Chemical Co., a commercial supplier. The suspension was cooled in an ice bath and methanesulfonyl chloride (5.67 g; 3.83 ml; 49.5 mmol) was added dropwise via a pipette. The reaction mixture was allowed to warm to room temperature, and then stirred for 5 hours.

After dilution with water (100 mL), the organic layer was separated from the mixture and then washed with water (twice), 10% HCl (twice), water (once) and saturated brine (once). The solution was then dried over magnesium sulfate, and the solvent was removed under reduced pressure. The resulting yellow solid was recrystallized from a hexane/chloroform solvent to yield white needles of N-(4-bromobenzyl)methanesulfonamide. The yield was 7.6 g (64%), and the melting point (m.p.) was 145° C. to 148° C.

The $^1$H NMR spectrum of the methanesulfonamide was measured in $CDCl_3$ using a Broker AM360 MHz spectrometer and using the solvent proton signal as a reference. The results indicated that N-(4-bromobenzyl) methanesulfonamide was obtained. The theoretical elemental analysis for N-(4-bromobenzyl)methanesulfonamide is: C, 41.83%; H, 3.16%; N, 4.88%; S, 11.16%. The elemental analysis for the reaction product was C, 41.67%; H, 3.22%; N, 4.76%; S, 11.06%.

The N-(4-bromobenzyl)methanesulfonamide (6.8 g; 25.6 mmol) was then charged into a 300 mL Teflon® —lined bomb equipped with a Teflon® coated magnetic stirring bar along with palladium acetate (57 mg; 1 mole percent with respect to bromide), tris(o-tolyl)phosphine (155 mg; 2 mole percent with respect to bromide), triethylamine (10 mL) and acetonitrile (10 mL). The palladium acetate, triethylamine, and acetonitrile were all obtained from the Aldrich Chemical Company of Milwaukee, Wis. and were used without further purification. The bomb was then sealed, after which it was connected to a cylinder containing ethylene, which was used to flush the air from the bomb. The ethylene was obtained from Matheson Gas Products and used without purification. The bomb was then pressurized to 100 psi with ethylene, sealed, and placed in an oil bath at 95° C. The bomb was heated for 16 hours while the contents were stirred, then the bomb was cooled and vented into a hood.

Diethyl ether (100 mL) was added to the bomb, causing precipitation of the triethylamine hydrobromide as a white crystalline solid. All of the material was poured through a Buchner funnel, and the obtained salts were washed with a further 50 mL of diethyl ether. The solvent was removed from the combined filtrates on a rotary evaporator; the residue was dissolved in a small mount of ethyl acetate; and the solution was then passed through a short column of silica gel (50 g packed with the same solvent in a two inch diameter column). The solvent was removed to yield N-(4-vinylbenzyl)methanesulfonamide as a white solid (4.13 g; 76 percent).

The $^1$H NMR analysis was performed as described above and the results indicated that N-(4-vinylbenzyl) methanesulfonamide was obtained. The theoretical elemental analysis for N-(4-vinylbenzyl)methanesulfonamide is: C, 56.85%; H, 6.2%; N, 6.63%; S 15.17% and the actual analysis was: C, 56.71%; H, 6.21%; N, 6.55%; S, 15.07%.

Other synthesis routes to N-(4-vinylbenzyl) methanesulfonamide are contemplated. They are the reaction of vinylbenzyl chloride with a salt of methanesulfonamide, or reaction with a salt of N-acetylmethanesulfonamide followed by removal of the acetyl group.

Example 2: Synthesis of N-methyl-4-vinylbenzylsulfonamide

Figure 2:
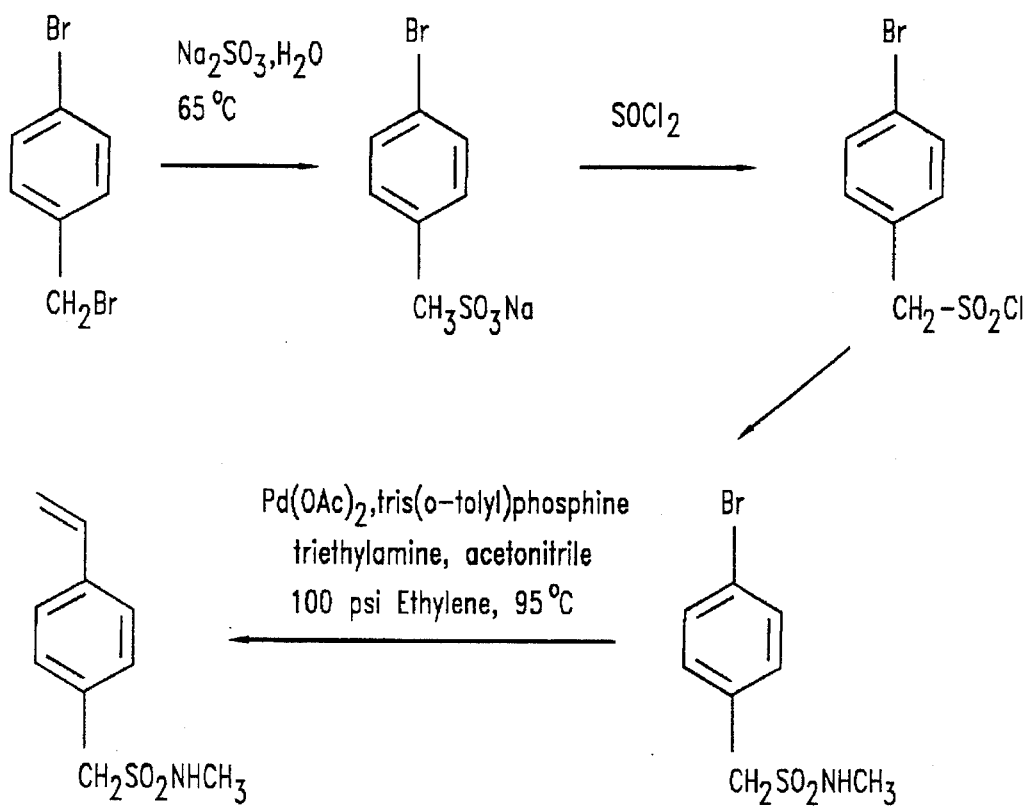
FIG. 2 is a schematic diagram of a reaction mechanism for the synthesis of N-methyl-4-vinylbenzylsulfonamide.

The synthesis of N-methyl-4-vinylbenzylsulfonamide is described in detail below. The synthesis is illustrated in FIG. 2.

A solution of sodium sulfite in water (500 mL) was prepared (205 g; 1.63 mol). To this solution was added 4-bromobenzyl bromide (20 g; 0.54 mol) which was obtained from the Aldrich Chemical Co. The mixture was heated to 75° C. and held at this temperature for 6 hrs. The 4-bromobenzyl bromide was observed to melt in the solution and then dissolve to form a faintly cloudy solution. After about 4 hours, a white precipitate formed. The solution was then cooled to about 5° C. and filtered. The recovered white crystalline substance was recrystallized from warm water and dried in a vacuum oven over $P_2O_5$. The yield of 4-bromobenzylsulfonic acid, sodium salt was 13.7 g (63%). The $^1$H NMR spectrum (measured in DMSO-$d_6$) confirmed that this was the reaction product.

The 4-bromobenzylsulfonic acid, sodium salt (12.9 g, 43.6 mmol) was combined without further purification with phosphorus pentachloride (10.8 g, 52 mmol) to form an intimate mixture. The mixture was heated to 80° C. under a nitrogen atmosphere and became homogeneous after about 30 minutes. The reaction mixture was maintained at this temperature for about 5 hours. It was then cooled, diluted with diethyl ether and added to a large volume of ice. The ether layer was separated, washed with water and a saturated brine solution and dried over magnesium sulfate. The solvent was then removed with a rotary evaporator to obtain 4-bromobenzylsulfonyl chloride (13.3 g), a small quantity of which was recrystallized from hexane for analysis. The m.p. was about 114° C. to about 116° C. and the $^1$H NMR spectrum confirmed that the reaction product was 4-bromobenzylsulfonylchloride. The theoretical elemental analysis for bromobenzylsulfonylchloride is: C, 31.19%; H, 2.24%; S, 11.89% and the actual analysis was: C, 31.23%; H, 2.41%; S, 11.73%.

Methylamine (about 10 mL) was condensed into a flask containing methylene chloride (100mL) and equipped with a Dry Ice condenser. The flask was cooled to 0° C. using an ice bath. A solution of 4-bromobenzylsulfonyl chloride (13.1 g; 48.3 mmol) and methylene chloride (50 mL) was added rapidly to this methylamine solution. The mixture was maintained at 0° C. for two hours while being stirred, after which the Dry Ice condenser and the ice bath were removed, and the excess methylene was allowed to evaporate from the solution. The methylene chloride was removed at reduced pressure, and the residue was flushed through a short plug of silica gel, using ethyl acetate as the eluant. N-Methyl-4-bromobenzylsulfonamide was recovered by evaporating the ethyl acetate from the residue followed by recrystallization of the residue in methanol.

N-Methyl-4-vinylbenzylsulfonamide was synthesized from N-methyl-4-bromobenzylsulfonamide using a reaction similar to the one described in Example 1. The N-methyl-4-bromobenzylsulfonamide (6 g; 22.6 mmol) was combined with palladium acetate (50 mg; 1 mole percent) and tris(o-tolyl)phosphine in 20 mL of 1:1 acetonitrile-triethylamine, and the resulting mixture was held under 10 psi of ethylene at 95° C. for 14 hours. The palladium acetate and tris(o-tolyl)phosphine were obtained from the Aldrich Chemical Company. The resulting product was purified by removing the solvent, followed by chromatography on silica with ethyl acetate and recrystallization from methanol. The product (4.31 g, 90% yield) was recovered as white plates with a m.p. of 103° to 105° C. The $^1$H NMR spectrum identified the product as N-methyl-4-vinylbenzylsulfonamide.

Example 3: Synthesis of a resist polymer of the present invention

A resist polymer of the present invention was synthesized from a feed composition that was nominally fifty percent tert-butoxycarbonyloxystyrene (5.5 g; 25 mmol) and fifty percent N-(4-vinylbenzyl)methanesulfonamide (5.27 g; 25 mmol). The feed composition was combined with dry tetrahydrofuran (THF) (100 mL) in a heavy walled polymerization tube. To this was added a polymerization catalyst, azobisisobutyronitrile (AIBN) (164 mg; 2 mmol; 2 mol % with respect to the total monomer in the feed composition). The solution was then degassed by a series of three freeze-pump-thaw cycles. The tube was sealed and placed in a temperature controlled bath, the temperature of which was held at about 68° C. to 72° C. The polymerization reaction mixture was maintained at this temperature for about 22 hours, after which the solution was cooled and vented. The resulting polymer was recovered by precipitation in hexane; and then purified by dissolution in a minimal amount of THF followed by precipitation into methanol (twice). The polymer, poly(t-BOCoxystyrene-co-N-(4-vinylbenzyl) methanesulfonamide), was then dried in a vacuum oven maintained at 35° C. overnight. The yield was 5.91 g (~55%).

Example 4: Synthesis of a Sulfonamide-Containing Terpolymer

A solution was prepared by combining N-(4-vinylbenzyl) methanesulfonamide (20 g; 94 mmol), prepared as described in Example 1, and tert-butoxycarbonyloxystyrene (13.83g; 62 mmol) in dry acetonitrile (18.5 mL) in a heavy wall polymerization tube. After degassing by a series of three freeze pump thaw cycles dry sulfur dioxide (15.5 mL at –78° C.) was distilled into the reaction vessel. To this solution was added azobisisobutyronitrile (AIBN) (0.86 g; 5 mole percent with respect to total monomer). The tube was sealed and placed in an oil bath maintained at a temperature between 55° C. and 60° C. The polymerization reaction was heated for 2.5 h, cooled and vented. Acetone (100 mL) was added to the reaction mixture, and the polymer was recovered by precipitation into methnol (2 times). The product, poly [N-(4-vinylbenzylsulfonamide)$_{0.36}$-co-(t-BOCoxystyrene)$_{0.31}$-co-(SO$_2$)$_{0.32}$], was dried in a vacuum oven at 35° C. overnight Using the synthesis described in examples 3 and 4 above, numerous polymers were synthesized. These polymers were either copolymers of N-(4-vinylbenzyl)methanesulfonamide or N-methyl-4-vinylbenzylsulfonamide with t-BOCoxystyrene monomer, or terpolymers of N-(4-vinylbenzyl)methansulfonamide, t-BOCoxystyrene, and SO$_2$. The properties of these polymers are enumerated in NHSO$_2$ or SO$_2$ NH, the t-BOCoxystyrene monomer by t-BOC and the sulfur Table 1 below. The content of each monomer in the polymer is indicated by its mole fraction in the feed composition. The sulfonamide monomer is represented by NHSO$_2$ SO$_2$NH, the t-BOCoxystyrene monomer by t-BOC and the sulfur dioxide by SO$_2$.

TABLE 1

| Polymer Composition | $M_w$ (× 10$^3$) | $M_w/M_n$ | Optical Density Abs/μm | Intrinsic Viscosity (dL/gm) | $T_g$ (°C.) | $T_o$ (°C.) | $T_d$ (°C.) |
|---|---|---|---|---|---|---|---|
| P(NHSO$_2$)$_{0.9}$(t-Boc)$_{0.1}$ | 37.8 | 1.42 | 0.09 | 0.08 | 90 | 148 | 348 |
| P(NHSO$_2$)$_{0.75}$(t-Boc)$_{0.25}$ | 33.5 | 1.51 | 0.12 | 0.06 | 96 | 161 | 347 |
| P(NHSO$_2$)$_{0.62}$(t-Boc)$_{0.37}$ | 36.5 | 1.58 | 0.06 | 0.09 | 106 | 167 | 351 |
| P(NHSO$_2$)$_{0.5}$(t-Boc)$_{0.5}$ | 38.8 | 1.66 | 0.08 | 0.11 | 108 | 170 | 350 |
| P(NHSO$_2$)$_{0.38}$(t-Boc)$_{0.32}$(SO$_2$)$_{0.30}$ | 127 | 2.04 | 0.19 | 0.13 | 128 | 154 | 379 |
| P(NHSO$_2$)$_{0.36}$(t-Boc)$_{0.31}$(SO$_2$)$_{0.32}$ | 181 | 1.67 | 0.18 | 0.09 | 136 | 161 | 376 |
| P(NHSO$_2$)$_{0.34}$(t-Boc)$_{0.31}$(SO$_2$)$_{0.35}$ | 83 | 1.95 | 0.17 | 0.10 | 137 | 156 | 356 |
| P(SO$_2$NH)$_{0.5}$(t-Boc)$_{0.5}$ | 23.4 | 1.53 | 0.13 | 0.08 | 119 | 173 | 363 |

$T_g$ = Glass Transition temperature.
$T_o$ = Onset of t-Boc loss.
$T_d$ = Decomposition temperature.

Example 5: Lithographic Properties of the Resist Polymers of the Present Invention Resist solutions were prepared by dissolving the polymers enumerated in Table 1. in cyclohexanone at fifteen weight percent relative to the solvent. To these resist solutions was added 2-nitro-6-trifluoromethylbenzyl tosylate (15 percent by weight relative to the weight of the polymer) as a photoacid generator (PAG). The solutions were filtered using Millipore Teflon filters with an average pore size of no more than 0.2 μm.

Resist films were deposited on silicon substrates previously primed with hexamethyldisilazane (HMDS) by spin coating the resist solution onto 4-inch silicon substrates at spinning speeds ranging from 2000 to 2500 rpm. The resist films had a thickness of about 0.6 to about 0.75 μm. The coated substrates were then baked at 120° C. for 30 seconds on a hot plate while subject to vacuum.

The films so deposited were then patternwise exposed to radiation at 248 nm using a Suss Model MA56A contact aligner equipped with a Lambda Physik excimer laser or a GCA Laser Step deep UV exposure tool. After exposure the wafers were baked for 30 seconds at a temperature of 120° C.

The images introduced into the resist were then developed using a solution of tetramethylammonium hydroxide (TMAH) (25 percent by weight in water) which was further diluted by a ratio of about 1 part TMAH to 9 parts water by volume. Propanol (10 percent by volume) was added to the developer solution as needed. The exposed and baked films were developed in the aqueous base solution for about 1 to 2 minutes.

Numerous properties of the polymers are enumerated in Table 1. The molecular weight of the various polymers varied widely. The polydispersivity, Mw/Mn, was less variable among the polymers. All of the polymers had optical densities less than 0.2. The optical density was measured using a conventional spectrophotometer employing spun films on fused silica substrates. The glass transition temperature of the terpolymers was higher than the glass transition temperatures of the copolymers, making the terpolymers more suited for lithography. The onset temperature of thermal t-BOC cleavage was slightly higher for the copolymers with greater than twenty-five percent by weight t-BOCoxystyrene in the feed composition.

The thermal analysis was obtained using a Perkin-Elmer TGA-7 thermogravimetric analyzer interfaced with a TAC 7 thermal analysis controller and a PE-7700 data station. The TGA samples were heated at a rate of 10° C./min. with a purified $N_2$ gas flow of 20 cm₃/min. DSC samples were heated at a rate of 20° C./min.

Example 6

α,α'-Dibromo-m-xylene (52.5 g, 0.2 mol), (obtained from the Aldrich Co. and distilled under reduced pressure), chloroform (50 mL) (washed with water to remove ethanol and dried), and Aliquat® 366 (1 g), (obtained from the Aldrich Co.) were added to a suspension of sodium sulfite (60 g; 0.47 mol) in water (80 mL) maintained at 90° C. The mixture was heated for 2 hours, and a heavy precipitate of sodium bromide formed. The semisolid white mass was cooled, filtered, washed with ice water (100 mL) and vacuum-dried. The white solid was washed with ether (200 mL) to remove any unreacted starting materials. The resulting crude sodium m-xylene-disulfonate was combined with phosphorous pentachloride (50 g; 0.24 moles) in a 500 mL flask. An exothermic reaction occurred and was controlled by periodically immersing the flask in an ice bath. After the exothermic reaction had subsided, the light yellow suspension was stirred at 100° C. for 4 hours. The reaction mixture was then poured into ice cold water (500 mL) and stirred for 15 minutes. Methylene chloride was added to dissolve the pasty white precipitate, and the organic layer was separated from the solution, washed with sodium carbonate and brine (10% solution), and reduced to about 200 mL. Petroleum ether (100 mL) was added to the flask, which then stood overnight at a temperature of 0° C. The resulting white crystals were filtered and recrystallized once from methylene chloride/hexane mixture. The white crystals were determined to be m-xylylenedisulfonyl chloride (32.5g).

A solution of α,α'-diamino-m-xylene (2.1 g; 15.4 mmol) (obtained form the Aldrich Co. and distilled under reduced pressure) in sulfolane—10 percent chloroform (200 mL) was added to calcium hydroxide (2.48 g; 33 mmoles) in a 50 mL three-necked flask equipped with a mechanical stirrer. The sulfolane was obtained from the Aldrich Co. and distilled under reduced pressure. The resulting suspension was heated to 40° C. and a solution of m-xylylenedisulfonyl chloride (4.67 g; 15.4 mmoles) in sulfolane/10% chloroform solution (18 mL) was added thereto with vigorous stirring. The flask was immediately cooled for 5 minutes with a water bath. The water bath was removed, and the reaction mixture was stirred for 2 hours at room temperature. The thick, white suspension was precipitated into a solution of methanol/water/acetic acid (150 mL/400 mL/20 mL) and stirred for 6 hours. The white, fibrous polymer was filtered, washed with copious amounts of water/methanol (1:1 v/v) and dried in a vacuum. A polysulfonamide with the general formula of:

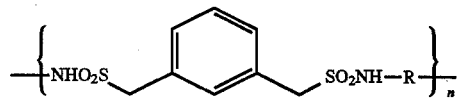

wherein R is m-xylylene was obtained.

Numerous other condensation polymers were prepared according to the procedures described generally above. The polymers were either homopolymers or copolymers with the general structure described above. The copolymers were polymers with the same general structure but with repeat units with two different formulas, each with a different R group. These polymers are enumerated in Table 2 below. The polymers are designated by the R group or R groups in the repeat unit. The mole percent of each type of repeat unit in the polymer is also provided.

TABLE 2

| Polymer | $\eta_{inh}$ | $T_g$ | $T_d$ °C. |
|---|---|---|---|
| R = m-xylylene | 0.132 | 123 | 280 |
| R = m-xylylene | 0.132 | 108 | 280 |
| R = m-xylylene | 0.062 | 105 | 280 |
| R = m-xylylene | 0.093 | 109 | 280 |
| R = 1,4-n-butylene | 0.181 | 140 | 300 |
| R = 1,4-n-butylene | 0.183 | 152 | 300 |
| R = 1,6-n-hexylene | 0.21 | | 310 |
| R = 1,3-cyclohexane bismethylene | 0.153 | 120 | 310 |
| R = m-xylylene (90 mole percent) | 0.093 | 109 | 280 |
| R = p-xylylene (10 mole percent) | | | |
| R = m-xylylene (80 mole percent) | 0.105 | 111 | 280 |
| R = p-xylylene (20 mole percent) | | | |
| R = m-xylylene (70 mole percent) | 0.131 | 113 | 280 |
| R = p-xylylene (30 mole percent) | | | |

TABLE 2-continued

| Polymer | $\eta_{inh}$ | $T_g$ | $T_d$ °C. |
|---|---|---|---|
| R = m-xylylene (1–3 mole percent) R = 1,3-cyclohexylbismethylene (1–3 mole percent) | 0.105 | 110 | 270 |
| R = m-xylylene (97–99 mole percent) R = 1,3-cyclohexyl bismethylene (1–3 mole percent) | 0.131 | 111 | 270 |

Thermal gravimetric analysis of the above polymers was carried out under argon and air in a Perkin-Elmer TGA-7 apparatus at a heating rate of 10 ° C. The glass transition temperatures ($T_g$) and the decomposition temperatures ($T_d$) were determined using a Perkin Elmer DSC-7 at a heating rate of 15 ° C./min. $\eta_{inh}$ is the inherent viscosity of the material.

Example 7

A solution was prepared of N-(4-vinylbenzyl) methanesulfonamide (15.0 g, 70 mmol), prepared as described in Example 1, and 4-acetoxystyrene (11.3 g, 70 mmol) in dry acetonitrile (27 mL) in a heavy wall polymerization tube. To this solution was added AIBN (774 mg., 3mol % with respect to total monomer). After degassing by a series of three freeze pump thaw cycles, the tube was sealed and placed in an oil bath, the temperature of which was kept between 65°–67° C. The polymerization reaction was heated for 5.5 h, cooled and vented. The polymer was recovered by removing the acetonitrile under vacuum, and the resulting white solid was dissolved in acetone (55 mL) and precipitated into isopropanol (300 mL). This purification procedure was repeated a second time. The product was dried in a vacuum oven at 35° C. overnight. The resulting polymer was poly[(N-(4-vinylbenzylsulfonamide)$_{0.5}$—co-(acetoxystyrene)$_{0.5}$].

Example 8

An energy sensitive resist composition was prepared by dissolving the condensation copolymer containing 80 mole percent repeat units with the m-xylylene R group and 20 mole percent repeat units with the p-xylylene R group in dimethylformamide. The resist solution was about 11 to about 15 percent by weight relative to the solvent. A quinonediazide dissolution inhibitor (15 weight percent relative to the polymer) was added to the solution. This dissolution inhibitor, designated PAC-28, is described in Uenishi, K., "Structural Effects of DNQ-PAC Backbone on Resist Lithographic Properties," SPIE, Vol. 1466, p. 115 (1991), which is incorporated by reference. The dissolution inhibitor was obtained from OCG, Inc. of East Providence, R.I. The solution was filtered through a Millipore Teflon® filter having a pore size of 0.2 micron.

The solution was spun onto a 5-inch diameter silicon wafers at a spinning speed of 2500 rpm to obtain a 0.7 μm thick film. The films were then baked at 120° C. for 60 seconds. The resist-coated substrates were than patternwise exposed on a GCA XLS deep UV exposure mol operating at 248 nm (0.53 numerical apemare and 4X reduction). After exposure, the wafers were baked for 30 seconds at 120° C. The exposed and baked films were developed in an aqueous solution of TMAH (0.262N) for 1–2 minutes. Features as small as 0.25 μm were observed in the patterned film.

We claim:

1. An energy sensitive material comprising:

a photoacid generator, a polymer that is a copolymer of at least a first monomer having the general structure selected from the group consisting of:

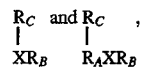

wherein $R_A$ is a lower alkylene moiety that contains 4 or fewer carbon atoms, $R_B$ is an alkyl group or an aryl alkyl group, X is selected from the group consisting of $NHSO_2$ and $SO_2NH$, and $R_C$ is an aliphatic or aromatic moiety that contains ethylenic unsaturation and a second monomer selected from the group consisting of styrene monomers, acetoxystyrene monomers, methacrylate monomers, and maleimide monomers, wherein at least 10 mole percent of the repeat units in the copolymer have a sulfonamide moiety, $NHSO_2$, and an acid-sensitive component selected from the group consisting of acid labile substituent groups on the second monomer and a dissolution inhibitor and wherein the energy-sensitive resist material after being exposed to radiation at a wavelength in the range of about 190 nm to 370 nm is substantially more soluble in a solution of aqueous base than the energy-sensitive material before being exposed to the radiation.

2. The energy sensitive material of claim 1 wherein the polymer is the copolymerization product of about 30 mole percent to about 90 mole percent of a vinylphenylalkylenesulfonamide monomer and about 10 to about 50 mole percent of a second monomer wherein the acid-sensitive component is the second monomer and the second monomer is a styrene with an acid-labile substituent group.

3. The energy sensitive resist material of claim 2 wherein the resist polymer is the copolymerization product of about 20 to about 40 mole percent of a third monomer wherein the third monomer is selected from the group consisting of $SO_2$, acetoxystyrene monomers and trimethylsilylstyrene monomers.

4. The energy-sensitive resist material of claim 1 wherein the acid-sensitive component is a dissolution inhibitor wherein the polymer is a copolymer of the sulfonamide monomer and a monomer selected from the group consisting of styrene monomers, acetoxystyrene monomers, methacrylate monomers, and maleimide monomers.

5. The energy sensitive material of claim 1 wherein the first monomer has a general structure that is selected from the group consisting of:

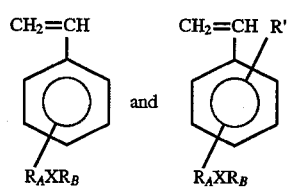

wherein R' is a lower alkyl group.

6. The energy sensitive material of claim 5 wherein $R_A$ is selected from the group consisting of methylene, ethylene, and propylene.

* * * * *